(12) United States Patent
Wu et al.

(10) Patent No.: US 11,432,398 B2
(45) Date of Patent: Aug. 30, 2022

(54) PRINTED CIRCUIT BOARD TRANSMISSION LINE AND ELECTRONIC DEVICE

(71) Applicant: HUAWEI TECHNOLOGIES CO., LTD., Guangdong (CN)

(72) Inventors: Yiyao Wu, Dongguan (CN); Xinbo Ma, Dongguan (CN); Zhiqiang Liao, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 17/104,388

(22) Filed: Nov. 25, 2020

(65) Prior Publication Data

US 2021/0084753 A1     Mar. 18, 2021

Related U.S. Application Data

(63) Continuation of application No. PCT/CN2019/087571, filed on May 20, 2019.

(30) Foreign Application Priority Data

May 29, 2018 (CN) .......................... 201810535150.0

(51) Int. Cl.
 *H05K 1/02* (2006.01)
 *H01R 12/53* (2011.01)

(52) U.S. Cl.
 CPC .......... *H05K 1/0271* (2013.01); *H01R 12/53* (2013.01); *H05K 1/0213* (2013.01); *H05K 2201/09036* (2013.01)

(58) Field of Classification Search
 CPC .. H05K 1/0271; H05K 1/0213; H05K 1/0215; H05K 2201/09036; H01R 12/53
 See application file for complete search history.

(56) References Cited

U.S. PATENT DOCUMENTS 5,530,289 A     6/1996  Hirano et al.
9,356,365 B2 *  5/2016  Yamada ............... H01R 9/0515
(Continued)

FOREIGN PATENT DOCUMENTS

CN       1655187 A    8/2005
CN     102570081 A    7/2012
(Continued)

OTHER PUBLICATIONS

Extended European Search Report issued in European Application No. 19810517.3 dated Jun. 10, 2021, 8 pages.
(Continued)

*Primary Examiner* — Hoa C Nguyen
(74) *Attorney, Agent, or Firm* — Fish & Richardson P.C.

(57) ABSTRACT

One example printed circuit board transmission line includes a substrate layer, a metal line, at least one first welding point, at least one first transmission medium, and a metal component that is configured to implement a grounding function. The metal line is plated on a surface of the substrate layer. The at least one first welding point is a welding point at which the metal line is connected to the at least one first transmission medium. The at least one first welding point is welded to the metal line and welded to the at least one first transmission medium. The metal component is welded to the at least one first transmission medium. At least one groove is provided on one side of the at least one first welding point.

20 Claims, 4 Drawing Sheets

(56) References Cited

U.S. PATENT DOCUMENTS

| | | | |
|---|---|---|---|
| 9,640,913 B1* | 5/2017 | Wang | H01R 13/6471 |
| 10,312,566 B2* | 6/2019 | Yamada | H01P 5/08 |
| 2003/0164537 A1 | 9/2003 | Brunner et al. | |
| 2007/0181337 A1* | 8/2007 | Miller | H05K 1/0243 |
| | | | 174/261 |
| 2009/0239401 A1* | 9/2009 | Fink | H05K 1/0271 |
| | | | 439/214 |
| 2014/0206230 A1* | 7/2014 | Rost | H01R 12/53 |
| | | | 439/607.01 |
| 2016/0183357 A1 | 6/2016 | Ho et al. | |

FOREIGN PATENT DOCUMENTS

| | | |
|---|---|---|
| CN | 103311229 A | 9/2013 |
| CN | 106165201 A | 11/2016 |
| JP | U54-020347 A | 7/1977 |
| JP | U54-173233 A | 5/1978 |
| JP | H04354361 A | 12/1992 |
| JP | 06112707 A | 4/1994 |
| JP | 07336006 A | 12/1995 |
| JP | 2003249729 A | 9/2003 |
| JP | 2009099637 A | 5/2009 |
| JP | 2010080730 A | 4/2010 |
| JP | 2014143104 A | 8/2014 |
| JP | 2014157794 A | 8/2014 |

OTHER PUBLICATIONS

Office Action issued in Chinese Application No. 201810535150.0 dated Apr. 29, 2020, 14 pages (with English translation).

PCT International Search Report and Written Opinion issued in International Application No. PCT/CN2019/087571 dated Aug. 19, 2019, 15 pages (with English translation).

Office Action issued in Japanese Application No. 2020-566715 dated Feb. 14, 2022, 9 pages (with English translation).

* cited by examiner

PRINTED CIRCUIT BOARD TRANSMISSION LINE AND ELECTRONIC DEVICE

CROSS-REFERENCE TO RELATED APPLICATIONS

This application is a continuation of International Application No. PCT/CN2019/087571, filed on May 20, 2019, which claims priority to Chinese Patent Application No. 201810535150.0, filed on May 29, 2018. The disclosures of the aforementioned applications are hereby incorporated by reference in their entireties.

TECHNICAL FIELD

This application relates to the field of circuit technologies, and in particular, to a printed circuit board transmission line and an electronic device.

BACKGROUND

With the development of science and technology, electronic devices are applied more and more widely. In a process of producing an electronic device, a high/low temperature reliability test needs to be performed on the electronic device. A printed circuit board transmission line is a key component of the electronic device. In a process of the high/low temperature reliability test, because in the printed circuit board transmission line, an expansion coefficient of a substrate layer is different from an expansion coefficient of a metal cavity or a metal plate used for grounding, in a high temperature test process, there is a problem of cracking or deformation of a welding point that is on a surface of the substrate layer in the printed circuit board transmission line and that is used to connect a transmission medium in the printed circuit board transmission line to a metal line on the surface of the substrate layer. Consequently, it is difficult to perform the reliability test on the electronic device.

Currently, mold resin is added to a surface of the printed circuit board transmission line, and the mold resin includes a metal oxide as filling, so that the mold resin has sufficient hardness. The mold resin covers the surface of the printed circuit board transmission line, to avoid the problem of cracking or deformation of the welding point that is on the surface of the substrate layer in the printed circuit board transmission line and that is used to connect the transmission medium in the printed circuit board transmission line to the metal line on the surface of the substrate layer, where a cause of the problem is that in the printed circuit board transmission line, the expansion coefficients of the substrate layer and a metal component are different.

However, when the mold resin is added to resolve the problem of deformation or cracking of the welding point that is on the surface of the substrate layer in the printed circuit board transmission line and that is used to connect the transmission medium in the printed circuit board transmission line to the metal line on the surface of the substrate layer, an additional material layer needs to be added, increasing costs of the printed circuit board transmission line.

SUMMARY

Embodiments of this application provide a printed circuit board transmission line and an electronic device, where at least one groove is provided on one side of at least one first welding point of the printed circuit board transmission line, so as to relieve an acting force exerted on the at least one first welding point when a metal component expands, thereby resolving a problem caused by different thermal expansion coefficients of materials in the printed circuit board transmission line, where the problem is deformation, cracking, or the like of the first welding point. There is no need to add any additional material layer, thereby reducing costs of the printed circuit board transmission line.

A first aspect of the embodiments of this application provides a structure of a printed circuit board transmission line. The printed circuit board transmission line includes: a substrate layer, a metal line, at least one first welding point, at least one first transmission medium, and a metal component that is configured to implement a grounding function. The metal line is plated on a surface of the substrate layer. The at least one first welding point is a welding point at which the metal line is connected to the at least one first transmission medium. The at least one first welding point is welded to the metal line and welded to the at least one first transmission medium. The metal component is welded to the at least one first transmission medium. At least one groove is provided on one side of the at least one first welding point, and the at least one groove is configured to relieve an acting force exerted on the at least one first welding point when the metal component expands. It can be learned from the first aspect that, in this embodiment, the at least one groove is provided on one side of the at least one first welding point to relieve the acting force exerted on the at least one first welding point when the metal component expands, thereby resolving a problem caused by different thermal expansion coefficients of materials in the printed circuit board transmission line, where the problem is deformation, cracking, or the like of the at least one first welding point. There is no need to add any additional material layer, thereby reducing costs of the printed circuit board transmission line.

In a possible implementation, a distance between the at least one groove and the at least one first welding point is less than a length of the at least one first welding point. In the possible implementation, the distance between the at least one groove and the at least one first welding point is limited to a length range of the at least one first welding point, the at least one groove is configured to effectively relieve the acting force exerted on the at least one first welding point when the metal component expands, thereby resolving the problem of cracking of the first welding point caused by the acting force exerted on the first welding point when the metal component expands.

In another possible implementation, the at least one groove is in an inverted L shape, and a longitudinal vertical length of the at least one groove is less than half of a width of the substrate layer. In the possible implementation, a specific structure of the groove is provided, and the longitudinal vertical length of the groove is less than half of the width of the substrate layer. When space of the printed circuit board transmission line is relatively limited, the inverted L-shaped groove may be provided on the at least one first welding point, so as to relieve, by using the inverted L-shaped groove, the acting force exerted on the at least one first welding point when the metal component expands.

In another possible implementation, the printed circuit board transmission line further includes at least one second welding point and at least one second transmission medium, where the at least one second welding point is disposed on one side of the at least one first welding point, the at least one second welding point is welded to the at least one second transmission medium, the at least one second transmission medium is welded to the metal component, and the at least one second welding point is configured to relieve the acting force exerted on the at least one first welding point when the metal component expands. In the possible implementation, the printed circuit board transmission line may further include the at least one second welding point and the at least one second transmission medium. The at least one second welding point is disposed on one side of the at least one first welding point, and then, the at least one second welding point is welded to the at least one second transmission medium. Therefore, the second welding point copies a stress environment of the first welding point. Therefore, during thermal expansion, the at least one second welding point may be configured to relieve the acting force exerted on the at least one first welding point when the metal component expands. The at least one groove is also configured to relieve the acting force exerted on the at least one first welding point when the metal component expands, and especially when the space of the printed circuit board transmission line is relatively limited, the second welding point may be disposed to share the acting force exerted by the metal component on the first welding point.

In another possible implementation, a distance between the at least one second welding point and the at least one first welding point is less than the length of the at least one first welding point. In the possible implementation, the distance between the at least one second welding point and the at least one first welding point is limited to a length range of the at least one first welding point, the at least one second welding point is configured to effectively relieve the acting force exerted on the at least one first welding point when the metal component expands, thereby resolving the problem of cracking of the first welding point caused by the acting force exerted on the first welding point when the metal component expands.

In another possible implementation, a material of the at least one welding point is the same as a material of the metal line, and a material of the at least one second welding point is the same as the material of the metal line. A specific material of a welding point is provided, to improve feasibility of the solution in an actual application process.

In another possible implementation, a length of the at least one second welding point is consistent with the length of the at least one first welding point, and a width of the at least one second welding point is consistent with a width of the at least one first welding point. In the possible implementation, the length and the width of the second welding point are set to be consistent with those of the first welding point. In this case, during thermal expansion, the second welding point may share nearly half of the acting force exerted on the first welding point when the metal component expands, thereby resolving the problem of cracking of the first welding point caused by the acting force exerted on the first welding point when the metal component expands.

In another possible implementation, the metal component may be a metal cavity, and the metal cavity may be disposed on a periphery of the substrate layer and welded to the at least one first transmission medium. In the possible implementation, a specific structure of the metal component is provided, to improve implementability of the solution.

In another possible implementation, the metal component may be a metal plate, and the metal plate is disposed on a bottom surface of the substrate layer and welded to the at least one first transmission medium. In the possible implementation, another specific structure of the metal component is provided, to improve diversity of the solution.

In another possible implementation, the at least one first transmission medium may include a cable or a probe, and the at least one second transmission medium may be a cable or a probe. In the possible implementation, two possible structures of the first transmission medium and the second transmission medium are provided, to improve implementability of the solution in actual implementation.

A second aspect of the embodiments of this application provides an electronic device. The electronic device includes the printed circuit board transmission line in any possible implementation of the first aspect.

According to the foregoing technical solutions, it can be learned that the embodiments of this application have the following advantages.

It can be learned from the foregoing technical solutions that the printed circuit board transmission line includes the substrate layer, the metal line, the at least one first welding point, the at least one first transmission medium, and the metal component that is used for grounding. The metal line is plated on the surface of the substrate layer. The at least one first welding point is the welding point at which the metal line is connected to the at least one first transmission medium. The at least one first welding point is welded to the metal line and welded to the at least one first transmission medium. The metal component is welded to the at least one first transmission medium. The at least one groove is provided on one side of the at least one first welding point, and the at least one groove is configured to relieve the acting force exerted on the at least one first welding point when the metal component expands. Therefore, the groove is provided on one side of the first welding point to relieve the acting force exerted on the first welding point when the metal component expands, thereby resolving the problem caused by different thermal expansion coefficients of materials in the printed circuit board transmission line, where the problem is deformation, cracking, or the like of the first welding point. There is no need to add any additional material layer, thereby reducing costs of the printed circuit board transmission line.

DESCRIPTION OF EMBODIMENTS

Embodiments of this application provide a printed circuit board transmission line and an electronic device, where at least one groove is provided on one side of at least one first welding point of the printed circuit board transmission line, so as to relieve an acting force exerted on the at least one first welding point when a metal component expands, thereby resolving a problem caused by different thermal expansion coefficients of materials in the printed circuit board transmission line, where the problem is deformation, cracking, or the like of the first welding point. There is no need to add any additional material layer, thereby reducing costs of the printed circuit board transmission line.

To make persons skilled in the art understand the solutions in the present invention better, the following clearly and completely describes the technical solutions in the embodiments of the present invention with reference to the accompanying drawings in the embodiments of the present invention. It is clear that, the described embodiments are merely some rather than all of the embodiments of the present invention. All other embodiments obtained by persons of ordinary skill in the art based on the embodiments of the present invention without creative efforts shall fall within the protection scope of the present invention.

In the specification, claims, and accompanying drawings of this application, the terms "first", "second", "third", "fourth", and the like (if used) are intended to distinguish between similar objects but do not necessarily indicate a specific order or sequence. It should be understood that the data used in such a way are interchangeable in a proper circumstance, so that the embodiments described herein can be implemented in an order other than the order illustrated or described herein.

The following describes in detail a printed circuit board transmission line according to an embodiment of this application with reference to the accompanying drawings.

Figure 1:
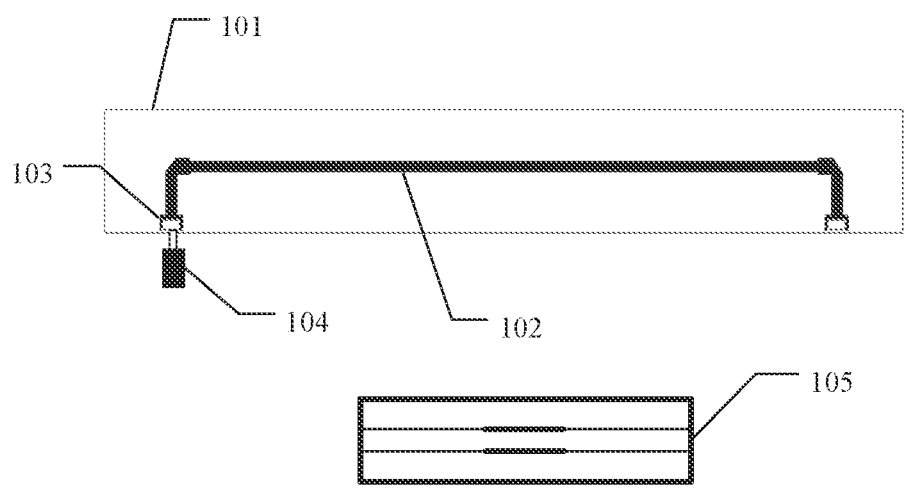
FIG. 1 is a schematic structural diagram of a printed circuit board transmission line according to an embodiment of this application.

FIG. 1 is a schematic diagram of an embodiment of a printed circuit board transmission line according to an embodiment of this application. As shown in FIG. 1, the printed circuit board transmission line includes a substrate layer 101, a metal line 102, at least one first welding point 103, at least one first transmission medium 104, and a metal component 105 that is used for grounding.

In a possible implementation, the metal component 105 is a metal cavity shown in FIG. 1. The metal cavity 105 is welded to the first transmission medium 104. The metal cavity is disposed on a periphery of the substrate layer 101 and welded to the first transmission medium 104 to implement a grounding function.

Figure 2:
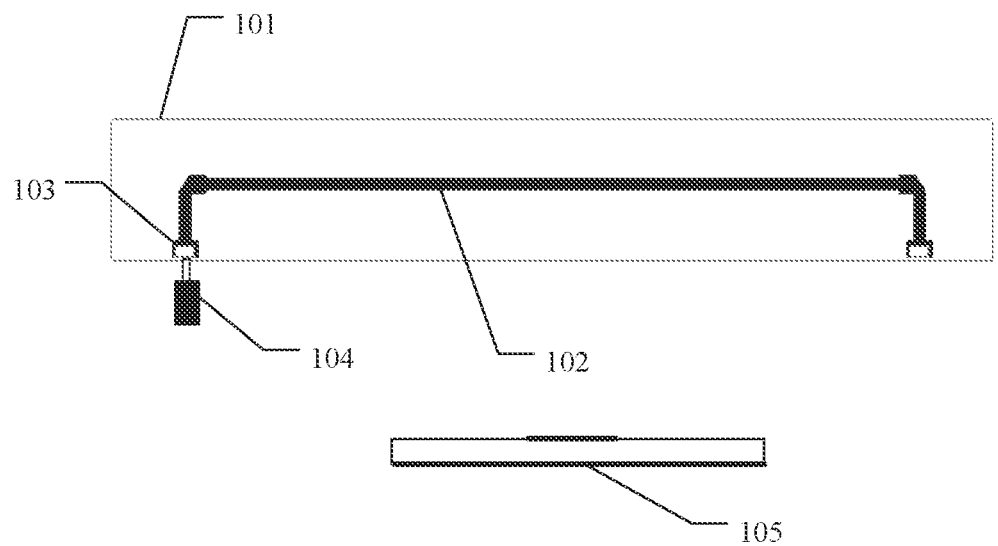
FIG. 2 is another schematic structural diagram of a printed circuit board transmission line according to an embodiment of this application.

In another possible implementation, the metal component 105 may be a metal plate 105 shown in FIG. 2. The metal plate 105 is disposed on a bottom surface of the substrate layer 101 and welded to the first transmission medium 104 to implement the grounding function.

It should be noted that the metal plate 105 may be disposed on the bottom surface of the substrate layer 101 and connected to the substrate layer 101 in a riveting manner. Alternatively, the metal plate 105 may be only disposed on the bottom surface of the substrate layer 101, in other words, the metal plate 105 does not need to be connected to the substrate layer 101. This is not specifically limited in this application.

Figure 3:
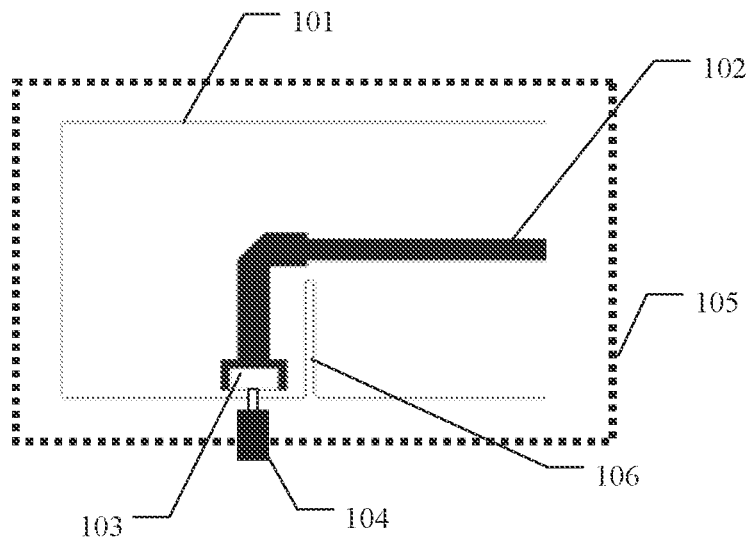
FIG. 3 is another schematic structural diagram of a printed circuit board transmission line according to an embodiment of this application.

FIG. 3 is an enlarged schematic diagram of a left part of the printed circuit board transmission line in FIG. 1. A connection relationship and a structure of the printed circuit board transmission line in FIG. 1 are described in detail below by using FIG. 3. The metal line 102 is plated on a surface of the substrate layer 101, the first welding point 103 is a welding point at which the metal line 103 is connected to the first transmission medium 104, and the first welding point 103 is welded to the metal line 102 and welded to the first transmission medium 104. The first transmission medium 104 is welded to the metal component 105 configured to implement the grounding function. The metal plate 105 is disposed on the bottom surface of the substrate layer 101 and combined with the substrate layer 101. A groove 106 is provided on one side of the first welding point 103, and the groove is configured to relieve an acting force exerted on the first welding point 103 when the metal component 105 expands.

Figure 4:
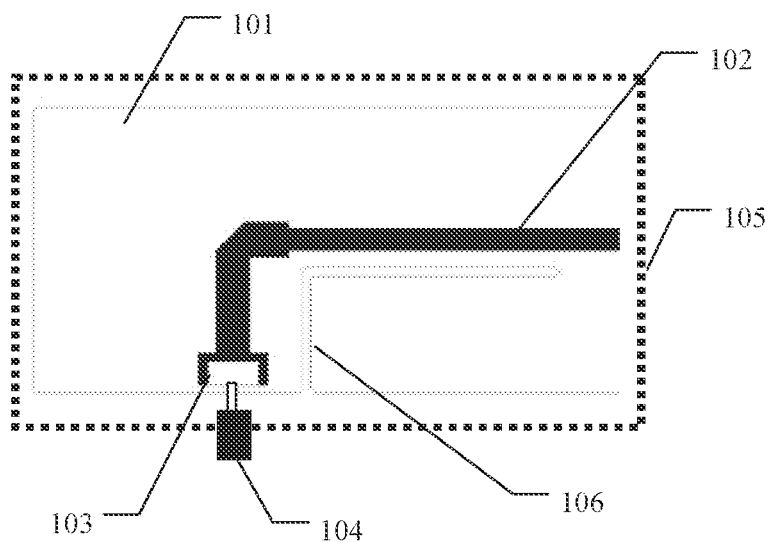
FIG. 4 is another schematic structural diagram of a printed circuit board transmission line according to an embodiment of this application.

Optionally, the groove 106 may be a longitudinal groove shown in FIG. 3, or may be an inverted L-shaped groove shown in FIG. 4, and a longitudinal vertical length of the groove is not greater than half of a width of the substrate layer 101.

Optionally, the printed circuit board transmission line in FIG. 1 may include at least one or more grooves 106. This is not limited in this application. In addition, a distance between the groove 106 and the first welding point 103 may be less than a length of the first welding point 103, or a distance between the groove 106 and the first welding point 103 may be another length. This is not limited in this application. When the distance between the groove 106 and the first welding point 103 is in a length range of the first welding point 103, the groove 106 can effectively relieve the acting force exerted by the groove 106 on the first welding point 103.

Figure 5:
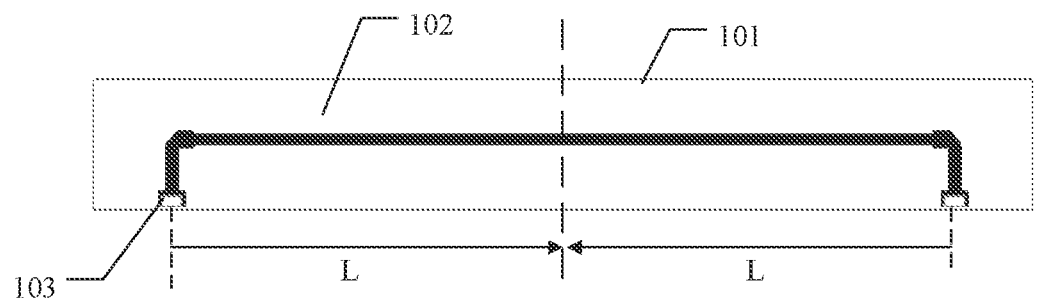
FIG. 5 is another schematic structural diagram of a printed circuit board transmission line according to an embodiment of this application.
Figure 6:
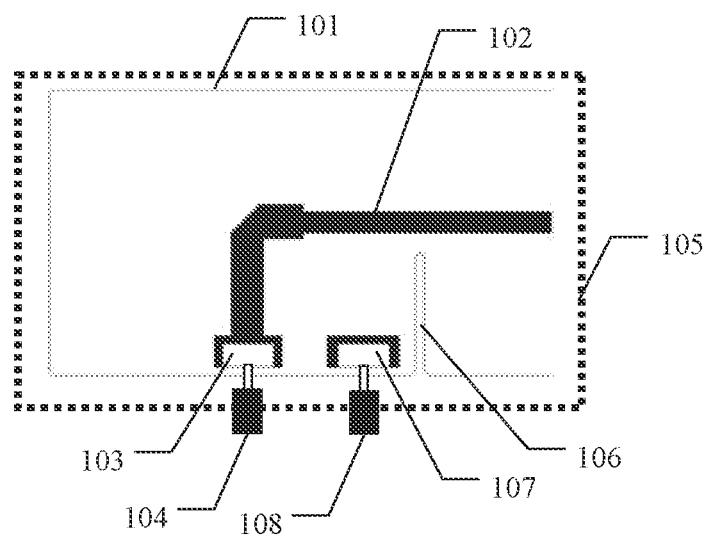
FIG. 6 is another schematic structural diagram of a printed circuit board transmission line according to an embodiment of this application.

It should be noted that this application provides a solution to resolve a problem caused by different thermal expansion coefficients of materials in the printed circuit board transmission line, where the problem is deformation, cracking, or the like of a first welding point. Therefore, in a reliability test process, a temperature keeps changing, and as the temperature changes, thermal expansion amounts of the materials are inconsistent. The following describes, by using FIG. 5, a case in which a warping problem of a metal line caused by different thermal expansion coefficients of the substrate layer 101 and the metal component 105 especially easy occurs. As shown in FIG. 6, a distance between the first welding point 103 and a midpoint of the substrate layer 101 is L. According to a thermal expansion coefficient formula, it can be learned that L needs to satisfy a formula (1.1):

$$L = a/(\Delta T * \Delta L) \quad (1.1),\text{where}$$

a is a thermal expansion coefficient of a material, $\Delta T$ is a difference between a highest temperature and a lowest temperature of an environment, and $\Delta L$ is a maximum length expansion variation that is of the material and that can be accepted when a problem of deformation, cracking, or the like does not occur at a welding point. Therefore, as shown in FIG. 6, a distance between the first welding point 103 and the midpoint of the substrate layer 101 is L (a unit of L is millimeter mm), a known thermal expansion coefficient of the substrate layer 101 is $a^1$, and a thermal expansion coefficient of the metal component is $a^2$. When $a^1$ and $a^2$ are fixed values, a formula (1.2) of an expansion difference generated between the metal component 105 and the substrate layer 101 is:

$$\Delta L = \Delta L1 - \Delta L2 = L * \Delta T * (a1-a2) \quad (1.2).$$

Therefore, a larger value of L indicates a larger expansion difference $\Delta L$ generated between the metal component 105 and the substrate layer 101. A stress on the first welding point 103 is calculated by using the following formula (1.3):

$$\delta = E * \Delta L \quad (1.3),\text{where}$$

$\delta$ is a stress exerted on the first welding point 103, and E is an elastic modulus of the material of the first welding point. A larger value of L indicates a larger stress δ on the first welding point 103. When δ reaches a limit value of the stress that can be accepted by the material of the first welding point 103, the first welding point 103 is especially easy to be cracked and deformed. For example, when the substrate layer 101 is made of RF30, the thermal expansion coefficient of the substrate layer 101 is a fixed value, and the thermal expansion coefficient of the metal component 105 is a fixed value. When the first welding point 103 is made of a metal copper line, parametric values such as a maximum stress value that can be accepted by the first welding point 103, the elastic modulus of the first welding point 103, and a temperature range assumed to be [−40° C., +125° C.] under a high/low temperature reliability test standard are substituted into the foregoing formula 2. It can be known that when the value L is 180 mm, the phenomenon that the first welding point 103 is deformed or cracked is more prominent.

Optionally, the printed circuit board transmission line may further include a second welding point 107 and a second transmission medium 108 that are shown in FIG. 6. The second welding point is disposed on the surface of the substrate layer 101 and welded to the second transmission medium 108. The second transmission medium 108 is welded to the metal component 105. The second welding point 107 is configured to relieve the acting force exerted on the first welding point 103 when the metal component 105 expands at a relatively high temperature. It can be learned from FIG. 6 that the second welding point 107 may share the stress on the first welding point 103 when the metal component 105 thermally expands.

It should be noted that one or more second welding points 107 may be disposed. This is not limited in this application.

In this embodiment, a length of the second welding point 107 may be consistent with the length of the first welding point 103, and a width of the second welding point 107 is consistent with a width of the first welding point 103. Certainly, the length of the second welding point 107 and the width of the second welding point 107 may also be other sizes. For example, the length and the width of the second welding point 107 are respectively half of the length and the width of the first welding point 103. Preferably, the length of the second welding point 107 is consistent with the length of the first welding point 103, and that the width of the second welding point 107 is consistent with the width of the first welding point 103 is a preferable solution. Because when the size of the second welding point 107 is consistent with the size of the first welding point 103, the second welding point 107 may share half of the acting force exerted by the metal component on the first welding point 103 when the metal component expands. However, when the size of the second welding point 107 is smaller than the size of the first welding point 103, the second welding point 103 shares less than half of the acting force. However, when the size of the second welding point 107 is greater than the size of the first welding point 103, the second welding point 107 may share more than half of the acting force exerted on the first welding point 103, while the second welding point 107 is easy to be cracked or deformed because of the excessive acting force exerted by the metal component on the second welding point 107. In this case, in the temperature reliability test process, because the second welding point 107 is damaged, in a subsequent temperature test process, the second welding point 107 cannot be configured to relieve the acting force exerted on the first welding point 103 when the metal component expands.

Optionally, the first transmission medium 104 may be a cable or a probe, or may be another type of transmission medium. This is not limited in this application. The second transmission medium 108 may be a cable or a probe.

Optionally, the substrate layer 101 may be made of RF30, or may be made of another type of material. This is not limited in this application.

Optionally, the metal line 102 may be a copper line, or may be a line of another metal type. This is not limited in this application.

Optionally, a material of the at least one first welding point 103 may be the same as the material of the metal line, and a material of the at least one second welding point 107 may be the same as the material of the metal line.

In this embodiment, the printed circuit board transmission line includes the substrate layer 101, the metal line 102, the at least one first welding point 103, the at least one first transmission medium 104, and the metal component 105 that is used for grounding. The metal line 105 is plated on the surface of the substrate layer 101. The at least one first welding point 103 is the welding point at which the metal line 102 is connected to the at least one first transmission medium 104. The at least one first welding point 103 is welded to the metal line 102 and welded to the at least one first transmission medium 104. The metal component 105 is welded to the at least one first transmission medium 104. The at least one groove 106 is provided on one side of the at least one first welding point 103, and the at least one groove 106 is configured to relieve the acting force exerted on the at least one first welding point 103 when the metal component 105 expands. Therefore, the groove is provided on one side of the first welding point 103 to relieve the acting force exerted on the first welding point when the metal component 105 expands, thereby resolving a problem caused by different thermal expansion coefficients of materials in the printed circuit board transmission line, where the problem is deformation, cracking, or the like of the first welding point. There is no need to add any additional material layer, thereby reducing costs of the printed circuit board transmission line.

A second aspect of the embodiments of this application further provides an electronic device. The electronic device is provided with the foregoing printed circuit board transmission line. The electronic device may be a phase shifter. The following describes, by using the phase shifter shown in FIG. 7, a structure including the foregoing printed circuit board transmission line, where the printed circuit board transmission line uses a copper line to transmit a signal, and a substrate layer is made of RF30. When a length of the substrate layer of the printed circuit board transmission line is greater than a length, it can be learned from the foregoing description of the structure of the printed circuit board transmission line that, in the printed circuit board transmission line, a distance between a first welding point 103 and a midpoint of the substrate layer 101 is greater than the preset length. In this case, the first welding point 103 is especially easy to be deformed or cracked.

Figure 7:
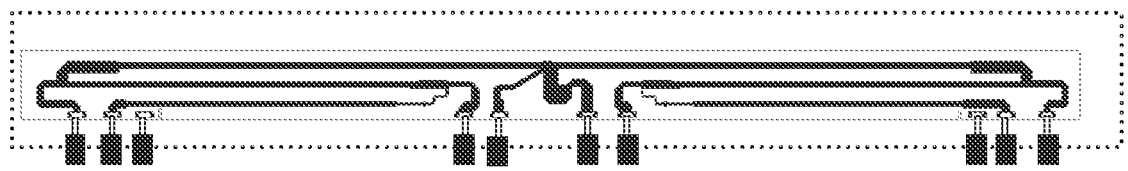
FIG. 7 is a schematic structural diagram of an electronic device according to an embodiment of this application.
Figure 8:
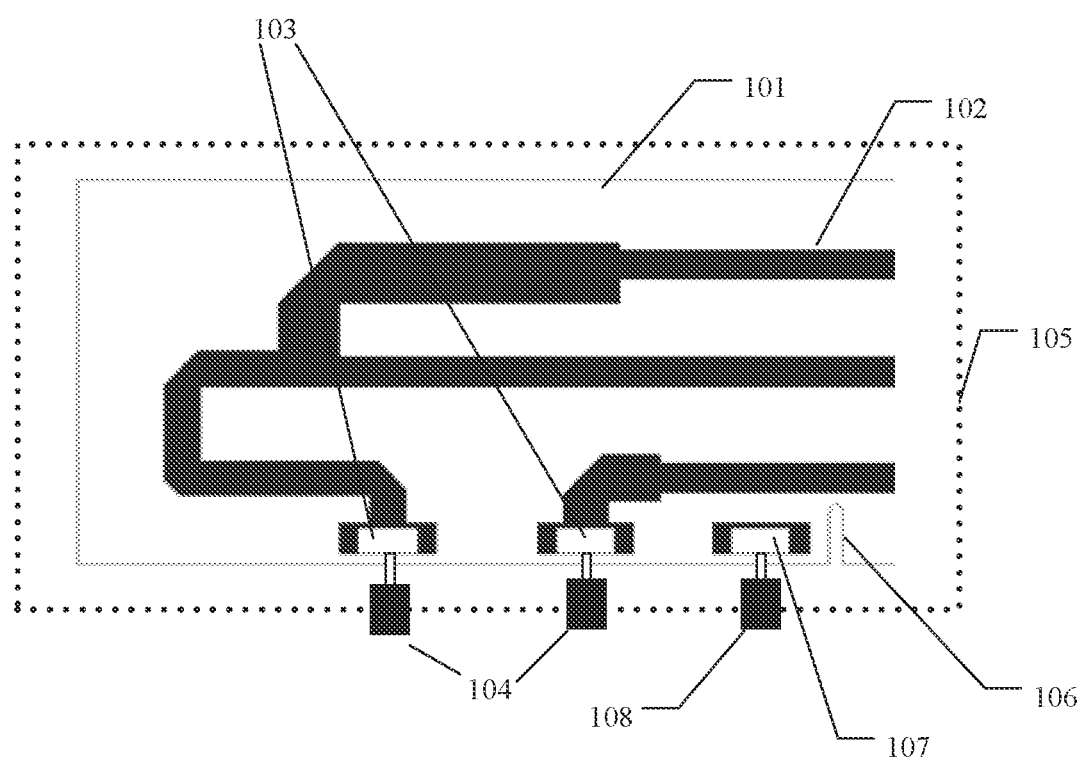
FIG. 8 is another schematic structural diagram of an electronic device according to an embodiment of this application.

FIG. 8 is a schematic diagram of a left structure of the printed circuit board transmission line in FIG. 7. At least one groove 106 is provided on one side of at least one first welding point 103, and a second welding point 107 and a second transmission medium 108 are disposed on one side of the at least one first welding point 103. When the entire printed circuit board transmission line expands as a temperature changes, because in the printed circuit board transmission line, thermal expansion coefficients of the substrate layer and a metal component are different, as the temperature changes, an acting force is exerted on the first welding point 103 when the metal component expands. Therefore, the at least one groove 106 is provided on one side of the first welding point 103, to relieve the acting force exerted on the first welding point 103 when the metal component expands.

Optionally, the printed circuit board transmission line may further include a second welding point 107 and a second transmission medium 108. The second welding point 107 is disposed on a surface of the substrate layer 101 and welded to the second transmission medium 108, and the second transmission medium 108 is welded to the metal component 105. The second welding point 107 is added to share the acting force exerted on the first welding point when the metal component 105 expands, thereby resolving a problem caused by different thermal expansion coefficients of materials in the printed circuit board transmission line, where the problem is deformation, cracking, or the like of the first welding point. There is no need to add any additional material layer, thereby reducing costs of the printed circuit board transmission line.

Therefore, the at least one groove 106, the second welding point 107, and the second transmission medium 108 are disposed on one side of the first welding point 103, so as to relieve the stress of the metal component on the first welding point when the metal component expands, and implement that in a long-term temperature cycle test in a high/low temperature reliability test condition, no welding point of the printed circuit board transmission line in the phase shifter has the problems of cracking and deformation. Therefore, according to the printed circuit board transmission line in the embodiments of this application, the groove is disposed on one side of the first welding point 103 to relieve the acting force exerted on the first welding point when the metal component 105 expands, thereby resolving the problem caused by different thermal expansion coefficients of materials in the printed circuit board transmission line, where the problem is deformation, cracking, or the like of the first welding point. There is no need to add any additional material layer, thereby reducing the costs of the printed circuit board transmission line.

The foregoing embodiments are merely intended for describing the technical solutions of this application, but not for limiting this application. Although this application is described in detail with reference to the foregoing embodiments, persons of ordinary skill in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A printed circuit board transmission line, wherein the printed circuit board transmission line comprises a substrate layer, a metal line, at least one first welding point, at least one first transmission medium, and a metal component that is configured to implement a grounding function and that is separated from the substrate layer, wherein the metal line is plated on a surface of the substrate layer, wherein the at least one first welding point is a welding point at which the metal line is connected to the at least one first transmission medium, wherein the at least one first welding point is welded to the metal line and welded to the at least one first transmission medium, wherein the metal component is welded to the at least one first transmission medium, wherein at least one groove is provided on one side of the at least one first welding point, and wherein the at least one groove is configured to reduce an acting force exerted on the at least one first welding point when the metal component expands.

2. The printed circuit board transmission line according to claim 1, wherein a distance between the at least one groove and the at least one first welding point is less than a length of the at least one first welding point.

3. The printed circuit board transmission line according to claim 1, wherein the at least one groove is in an inverted L shape, and wherein a longitudinal vertical length of the at least one groove is less than half of a width of the substrate layer.

4. The printed circuit board transmission line according to claim 1, wherein the printed circuit board transmission line further comprises at least one second welding point and at least one second transmission medium, wherein the at least one second welding point is disposed on one side of the at least one first welding point, wherein the at least one second welding point is welded to the at least one second transmission medium, and wherein the at least one second transmission medium is welded to the metal component.

5. The printed circuit board transmission line according to claim 4, wherein a distance between the at least one second welding point and the at least one first welding point is less than a length of the at least one first welding point.

6. The printed circuit board transmission line according to claim 4, wherein the at least one second welding point is configured to reduce the acting force exerted on the at least one first welding point when the metal component expands.

7. The printed circuit board transmission line according to claim 4, wherein a length of the at least one second welding point is consistent with the length of the at least one first welding point, and wherein a width of the at least one second welding point is consistent with a width of the at least one first welding point.

8. The printed circuit board transmission line according to claim 4, wherein the at least one first transmission medium comprises a first cable or a first probe, and wherein the at least one second transmission medium comprises a second cable or a second probe.

9. The printed circuit board transmission line according to claim 1, wherein the metal component comprises a metal cavity, and wherein the metal cavity is disposed on a periphery of the substrate layer and welded to the at least one first transmission medium.

10. The printed circuit board transmission line according to claim 1, wherein the metal component comprises a metal plate, and wherein the metal plate is disposed on a bottom surface of the substrate layer and welded to the at least one first transmission medium.

11. An electronic device, comprising a printed circuit board transmission line, wherein the printed circuit board transmission line comprises a substrate layer, a metal line, at least one first welding point, at least one first transmission medium, and a metal component that is configured to implement a grounding function and that is separated from the substrate layer, wherein the metal line is plated on a surface of the substrate layer, wherein the at least one first welding point is a welding point at which the metal line is connected to the at least one first transmission medium, wherein the at least one first welding point is welded to the metal line and welded to the at least one first transmission medium, wherein the metal component is welded to the at least one first transmission medium, wherein at least one groove is provided on one side of the at least one first welding point, and wherein the at least one groove is configured to reduce an acting force exerted on the at least one first welding point when the metal component expands.

12. The electronic device according to claim 11, wherein a distance between the at least one groove and the at least one first welding point is less than a length of the at least one first welding point.

13. The electronic device according to claim 11, wherein the at least one groove is in an inverted L shape, and wherein a longitudinal vertical length of the at least one groove is less than half of a width of the substrate layer.

14. The electronic device according to claim 11, wherein the printed circuit board transmission line further comprises at least one second welding point and at least one second transmission medium, wherein the at least one second welding point is disposed on one side of the at least one first welding point, wherein the at least one second welding point is welded to the at least one second transmission medium, and wherein the at least one second transmission medium is welded to the metal component.

15. The electronic device according to claim 14, wherein a distance between the at least one second welding point and the at least one first welding point is less than a length of the at least one first welding point.

16. The electronic device according to claim 14, wherein the at least one second welding point is configured to reduce the acting force exerted on the at least one first welding point when the metal component expands.

17. The electronic device according to claim 14, wherein a length of the at least one second welding point is consistent with the length of the at least one first welding point, and wherein a width of the at least one second welding point is consistent with a width of the at least one first welding point.

18. The electronic device according to claim 14, wherein the at least one first transmission medium comprises a first cable or a first probe, and wherein the at least one second transmission medium comprises a second cable or a second probe.

19. The electronic device according to claim 11, wherein the metal component comprises a metal cavity, and wherein the metal cavity is disposed on a periphery of the substrate layer and welded to the at least one first transmission medium.

20. The electronic device according to claim 11, wherein the metal component comprises a metal plate, and wherein the metal plate is disposed on a bottom surface of the substrate layer and welded to the at least one first transmission medium.

* * * * *